US005669125A

United States Patent [19]
Shida

[11] Patent Number: 5,669,125
[45] Date of Patent: Sep. 23, 1997

[54] METHOD OF MANUFACTURING AN INK-JET RECORDING HEAD

[75] Inventor: Yoshio Shida, Tokyo, Japan

[73] Assignee: NEC Corporation, Japan

[21] Appl. No.: 501,401

[22] Filed: Jul. 12, 1995

[30] Foreign Application Priority Data

Jul. 12, 1994 [JP] Japan .................................. 6-159976

[51] Int. Cl.[6] .............................. H01L 41/22; B41J 2/16

[52] U.S. Cl. ........................ 29/25.35; 29/890.1; 347/65

[58] Field of Search ............................ 29/25.35, 890.1; 310/340, 366, 368; 347/45, 47, 65, 68, 71, 72; 427/100

[56] References Cited

U.S. PATENT DOCUMENTS

| | | | |
|---|---|---|---|
| 4,766,671 | 8/1988 | Utsumi et al. | 29/848 |
| 5,265,315 | 11/1993 | Hoisington et al. | 427/100 X |
| 5,334,999 | 8/1994 | Kashiwazaki et al. | 29/890.1 X |
| 5,581,861 | 12/1996 | Lee et al. | 29/25.35 |

FOREIGN PATENT DOCUMENTS

| | | | |
|---|---|---|---|
| 484983 | 5/1992 | European Pat. Off. . | |
| 566875 | 10/1993 | European Pat. Off. . | |
| 3733109 | 4/1989 | Germany . | |
| 207660 | 9/1991 | Japan | 29/890.1 |
| 318733 | 12/1993 | Japan | 29/890.1 |

OTHER PUBLICATIONS

*Patent Abstracts of Japan*, vol. 14, No. 132 (M-0948) 13 Mar. 1990 & JP-A-02 003311, 8 Jan. 1990.

"Experimental manufacture of ink-jet printer having fine hole formed in ceramics" Nikkei Mechanical 1987. 12, pp. 17 to 18.

*Primary Examiner*—Peter Vo
*Attorney, Agent, or Firm*—Ostrolenk, Faber, Gerb & Soffen, LLP

[57] ABSTRACT

An ink-jet recording head includes a piezoelectric element, an ink cavity which is formed in the piezoelectric element to have a hollow shape and is filled with an ink, electrodes to which a drive voltage from the piezoelectric element is applied, and a metal foil film coated on an inner surface of the ink cavity. When the drive voltage is applied to the electrodes, the ink cavity is compressed by a displacement of the piezoelectric element to inject the filled ink.

6 Claims, 3 Drawing Sheets

METHOD OF MANUFACTURING AN INK-JET RECORDING HEAD

BACKGROUND OF THE INVENTION

The present invention relates to a printer head for an ink-jet printer and, more particularly, an ink-jet recording head for driving a multi-layer piezoelectric element to inject an ink and a method of manufacturing the multi-layer piezoelectric element.

In general, a drop on demand type ink-jet recording head drives a piezoelectric element to compress a pressure chamber constituting an ink cavity, thereby spraying a meniscus (bulge of liquid) formed at the distal end of an ink nozzle by a surface tension. FIGS. 4A and 4B explain the steps in manufacturing a conventional ink-jet recording head shown in "Experimental manufacture of ink-jet printer having fine hole formed in ceramics" NIKKEI MECHANICAL 1987. 12, pp. 17 to 18 (reference 1). The conventional ink-jet recording head and a method of manufacturing the same will be described below with reference to FIGS. 4A and 4B.

In step S10 of FIG. 4A, a hole forming pattern 10 consisting of a photosensitive resin shown in FIG. 4B is formed. In step S11, the hole forming pattern 10 is coated on a piezoelectric material 11 by thermocompression bonding. In step S12, a plurality of piezoelectric sheets 12 having electrodes 12*a* formed thereon are stacked on the hole forming pattern 10, and the piezoelectric sheets 12 and the hole forming pattern 10 are pressed against each other, thereby forming a multi-layer structure. In step S13, the photosensitive resin constituting the hole forming pattern 10 and a molding binder in each piezoelectric sheet 12 are removed in a binder removal process, thereby forming an ink cavity 13. Finally, in step S14, the multi-layer structure is sintered, and a recording head having the ink cavity 13 formed in a piezoelectric element is obtained.

In addition, when the hole forming pattern 10 consists of carbon, the hole forming pattern 10 is not removed in the binder removal process in step S13, and the hole forming pattern 10 is removed in the sintering process in step S14 to form the ink cavity 13.

However, in the above method of manufacturing the conventional ink-jet recording head for the multi-layer piezoelectric element, the piezoelectric material 11 exposed on the inner surface of the ink cavity 13 formed in the binder removal process. For this reason, in the sintering process, the piezoelectric material 11 may be broken, or the ink cavity 13 changes in size to degrade the dimensional accuracy of the ink-jet recording head. In addition, when an ink is filled in the ink cavity 13, the ink permeates into the piezoelectric material 11, and the ink does not smoothly flow in the ink cavity 13 because the hydrophilic properties of the ink with respect to the piezoelectric material 11 are poor.

SUMMARY OF THE INVENTION

It is an object of the present invention to provide an ink-let recording head having improved dimensional accuracy and a method of manufacturing the ink-jet recording head.

It is another object of the present invention to provide an ink-jet recording head capable of properly supplying an ink and a method of manufacturing the ink-jet recording head.

In order to achieve the above objects, according to the present invention, there is provided an ink-jet recording head comprising a piezoelectric element, an ink cavity which is formed in the piezoelectric element to have a hollow shape and is filled with an ink, electrodes to which a drive voltage from the piezoelectric element is applied, and a metal foil film coated on an inner surface of the ink cavity, wherein when the drive voltage is applied to the electrodes, the ink cavity is compressed by a displacement of the piezoelectric element to inject the filled ink.

DESCRIPTION OF THE PREFERRED EMBODIMENT

Figure 1A:
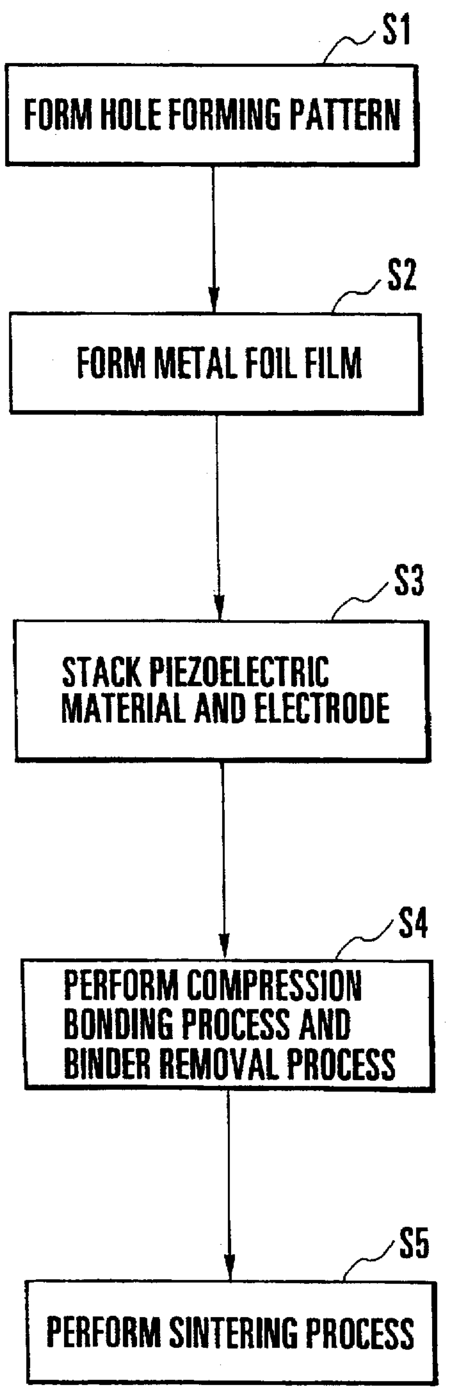
FIGS. 1A and 1B are a flow chart and a sectional view of an ink-jet recording head, respectively, for explaining the steps in manufacturing the ink-jet recording head according to the present invention.
Figure 1B:
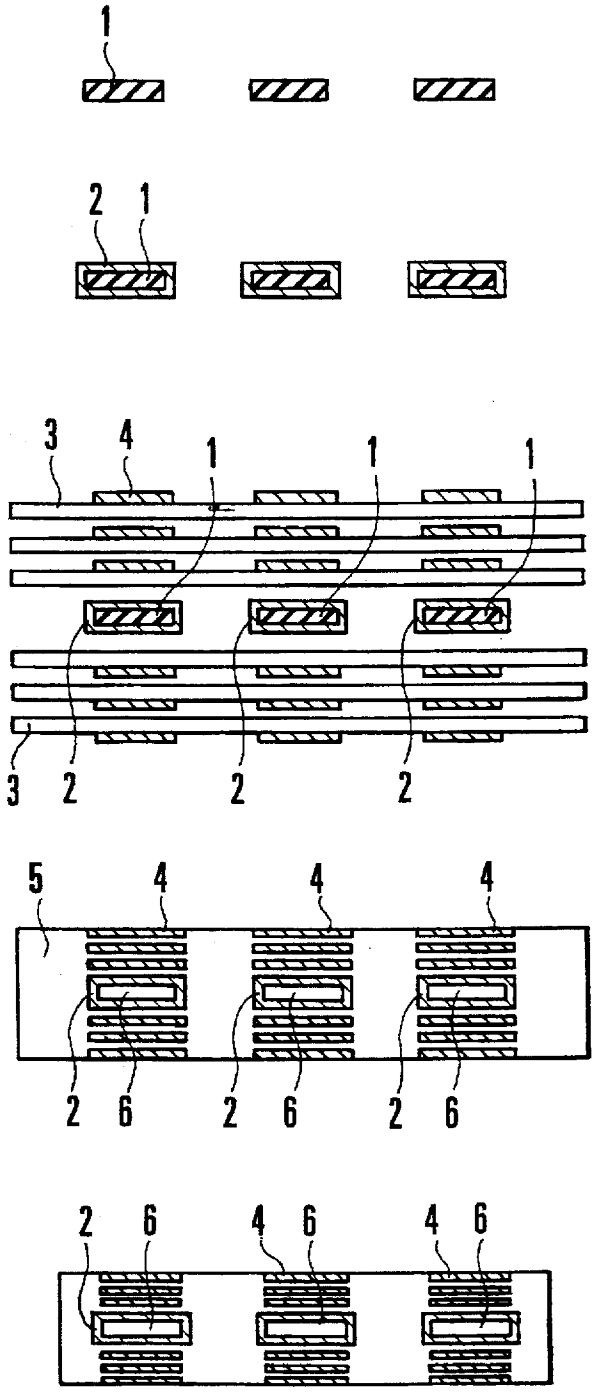
Figure 2:
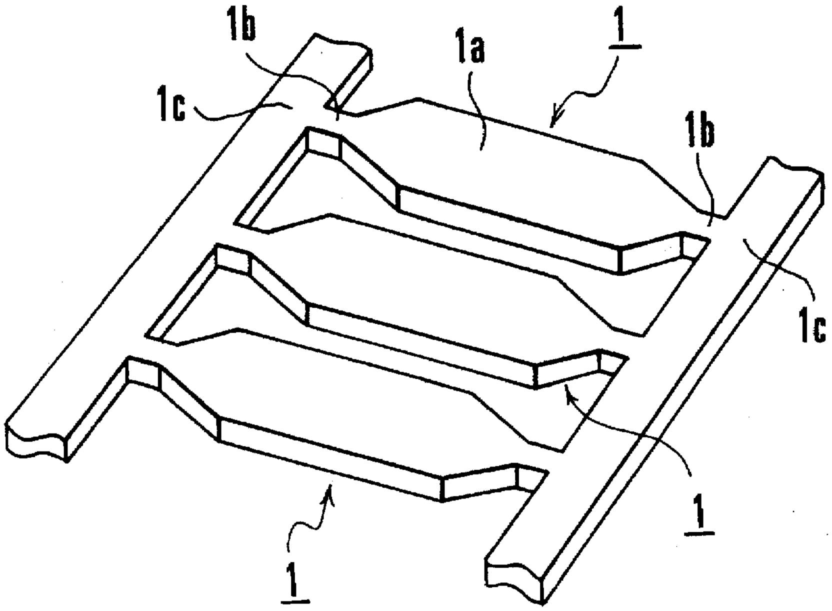
FIG. 2 is a perspective view showing a hole forming pattern member of the ink-jet recording head according to the present invention.
Figure 3:
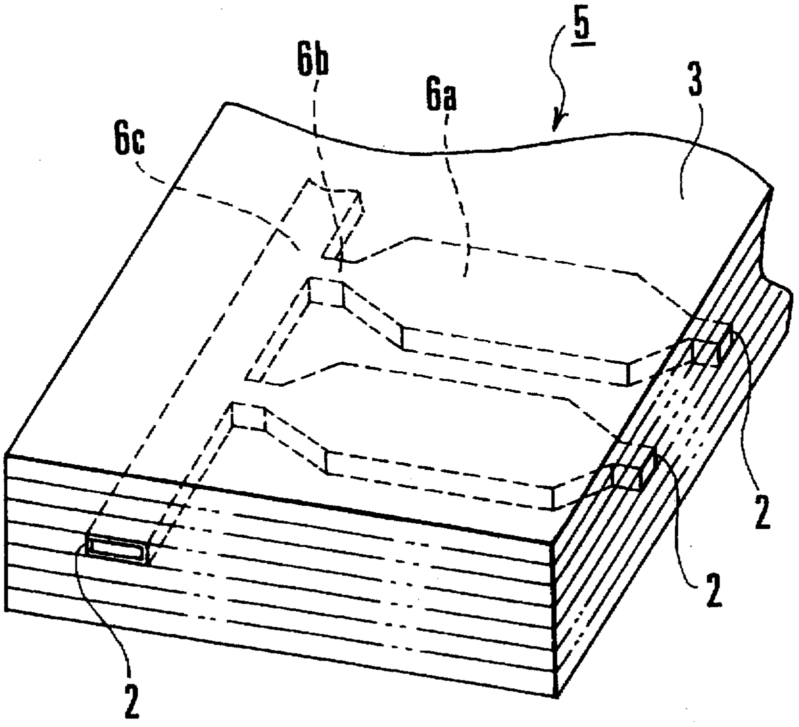
FIG. 3 is a perspective view showing the ink-jet recording head according to the present invention.
Figure 4A:
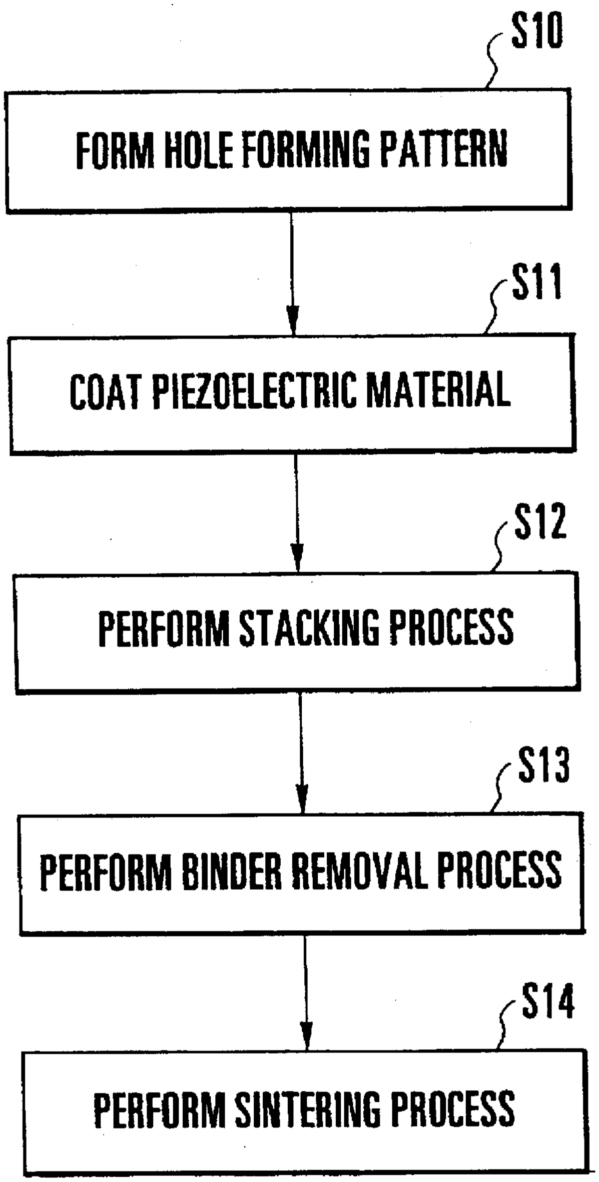
FIG.4A PRIOR ART
FIGS. 4A and 4B are a flow chart and a sectional view of a conventional ink-jet recording head, respectively, for explaining the steps in manufacturing the conventional ink-jet recording head.
Figure 4B:
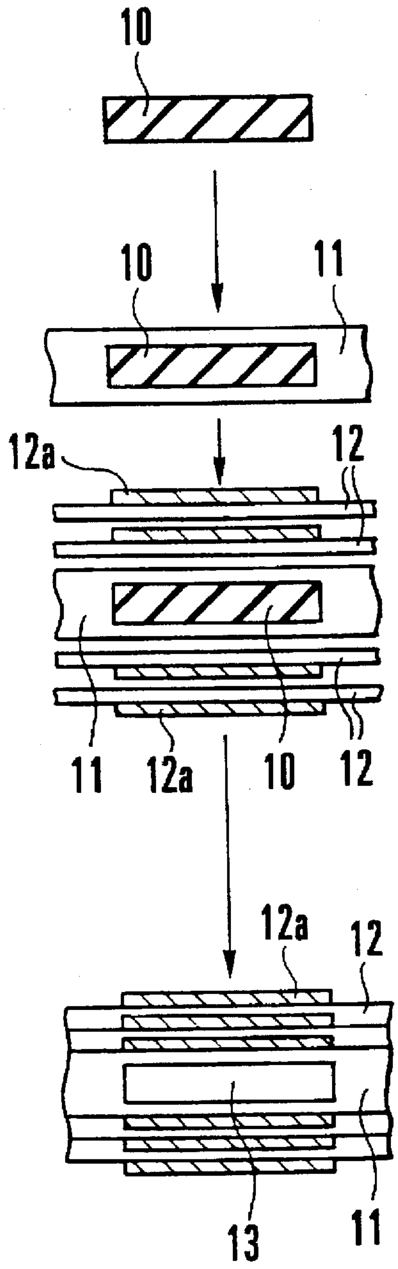
FIG.4B PRIOR ART

An embodiment of the present invention will be described below with reference to the accompanying drawings. FIGS. 1A and 1B explain the steps in manufacturing an ink-jet recording head. FIG. 2 shows a hole forming pattern shown in FIG. 1B, and FIG. 3 shows the ink-jet recording head according to the present invention. In step S1 of FIG. 1A, a hole forming pattern 1 shown in FIG. 1B is formed. As shown in reference 1 described above, the hole forming pattern 1 is formed by photolithograpy in which a mask for a hole forming pattern is placed on a polyester carrier film on which a photosensitive resin is uniformly coated, and an ultraviolet beam having a wavelength of 3,800 Å is irradiated on the carrier film, and the carrier film is developed using an organic solvent (trichloroethane). As shown in FIG. 2, the hole forming pattern 1 two-dimensionally formed as a whole and consisting of a photosensitive resin comprises a plurality of pressure chamber forming portions 1*a* arranged at the center of the hole forming pattern 1 and each having a spindle section, a pair of flow path forming portions 1*b* arranged at the both the ends of each pressure chamber forming portion 1*a*, and a pair of ink supply path forming portions 1*c* communicating with the pressure chamber forming portions 1*a* through the flow path forming portions 1*b*.

In step S2, the surface of the hole forming pattern 1 is plated with a metal such as nickel, thereby forming a metal foil layer 2. In step S3, a plurality of piezoelectric sheets 3 having electrodes 4 printed thereon are stacked to vertically sandwich the hole forming pattern 1 having the metal foil layer 2 formed thereon. As each piezoelectric sheet 3, a soft sheet, e.g., a ceramic green sheet, which consists of a piezoelectric material, contains 10 mass % of an organic binder, and is not sintered is used. In step S4, the piezoelectric sheets 3 are pressed against each other while the hole forming pattern 1 is sandwiched by the piezoelectric sheets 3 to form a multi-layer structure 5, and the photosensitive resin constituting the hole forming pattern 1 and the molding binder of the piezoelectric sheets 3 are melted and removed in a binder removal process in which heating is performed at about 500° C. for a relatively long period of time (several days to one week), thereby forming an ink cavity 6. At this time, the ink cavity 6 has the metal foil layer 2 coated on the inner surface of the ink cavity 6.

As shown in FIG. 3, the ink cavity 6 formed in the multi-layer structure 5 comprises pressure chambers 6*a*, flow paths 6b, and ink supply paths 6c corresponding to the pressure chamber forming portions 1a, the flow path forming portions 1b, and the ink supply path forming portions 1c of the hole forming pattern 1 shown in FIG. 2. Finally, in step S5, a sintering process in which the multi-layer structure 5 is heated at about 1,200° C. is performed, thereby forming a recording head. The flow paths 6b which face the side surface of the recording head function as nozzles for injecting an ink.

In this case, in order to keep the pitch accuracy of the ink cavity 6, when the hole forming pattern 1 is formed by supporting the both the ends of the pressure chamber forming portions 1a by the pair of ink supply path forming portions 1c as shown in FIG. 2, the multi-layer structure 5 may cut before the binder removal process to cut off one of the ink supply path forming portions 1c from the multi-layer structure 5. Therefore, the molten photosensitive resin can be easily removed in the binder removal process from the flow paths 6b which face the side surface of the multi-layer structure 5.

In the recording head formed as described above, when a drive voltage is applied to the electrodes 4, the piezoelectric material is bent to compress the pressure chambers 6a, an ink filled in the ink cavity 6 is compressed to inject the ink from the nozzles, and ink-jet recording is performed on a recording sheet.

As has been described above, according to the present invention, before the stacking process in step S3 and a pressing process in step S4, the metal foil layer 2 is formed on the surface of the hole forming pattern 1. For this reason, the metal foil layer 2 has a function of reinforcing the ink cavity 6. Therefore, in the sintering process for the multi-layer structure 5, the metal foil layer 2 formed on the entire inner surface of the ink cavity 6 prevents the piezoelectric material 3 from being broken or the ink cavity 6 from being changed in size, thereby improving the dimensional accuracy of the ink cavity 6.

In addition, when an ink is filled in the ink cavity 6, the metal foil layer 2 coated on the inner surface of the ink cavity 6 prevents the ink from permeating into the piezoelectric material 3. Since the ink has good hydrophilic properties with respect to the metal foil layer 2, the ink smoothly flows in the ink cavity 6.

In the above embodiment, although the hole forming pattern 1 consists of a photosensitive resin, the material of the hole forming pattern 1 is not limited to the photosensitive resin, and the hole forming pattern 1 may consist of carbon. In this case, a process of removing the carbon constituting the hole forming pattern 1 is performed in the sintering process for the multi-layer structure 5 in step S5.

In addition, if the process of cutting off one of the ink supply path forming portions 1c is performed before the binder removal process, the process may be performed in step S3 or S4. After the binder removal process is performed, one of the ink supply paths 6c may be cut off after the binder removal process or the sintering process. On the other hand, if the accuracy in the manufacturing steps can be kept, only one of the ink supply path forming portions 1c of the hole forming pattern 1 may be formed.

What is claimed is:

1. A method of manufacturing an ink-jet recording head, comprising the steps of:

forming a hole forming pattern consisting one of a resin and carbon, forming a metal foil film on a surface of said hole forming pattern;

stacking and pressing a plurality of piezoelectric sheets having electrodes formed thereon to sandwich said hole forming pattern, thereby forming a multi-layer structure; and removing said hole forming pattern in a binder removal process and a sintering process for said multi-layer structure, thereby forming an ink cavity, which has said metal foil film formed on an inner surface thereof, in said multi-layer structure.

2. A method according to claim 1, wherein said hole forming pattern consists of a resin, the step of removing said hole forming pattern comprises the step of performing a binder removal process for said multi-layer structure to remove said hole forming pattern, thereby forming an ink cavity in said multi-layer structure, and the step of performing a sintering process for said multi-layer structure in which said ink cavity is formed.

3. A method according to claim 2, wherein the step of forming said hole forming pattern comprises the step of developing a photosensitive resin on a carrier film using photolithography.

4. A method according to claim 1, wherein said hole forming pattern consists of carbon, the step of removing said hole forming pattern comprises the step of performing a binder removal process for said multi-layer structure, and the step of performing a sintering process for said multi-layer structure having subjected to the binder removal process, to remove the carbon constituting said hole forming pattern, thereby forming an ink cavity in said multi-layer structure.

5. A method according to claim 1, wherein the step of forming said metal foil film comprises the step of metal-plating a surface of said hole forming pattern.

6. A method of manufacturing an ink-jet recording head, comprising the steps of:

forming a hole forming pattern consisting of a photosensitive resin using photolithography;

forming a metal-plating layer on a surface of said hole forming pattern;

stacking and pressing a plurality of piezoelectric sheets having electrodes formed thereon to sandwich said hole forming pattern, thereby forming a multi-layer structure;

performing a binder removal process for said multi-layer structure to remove the photosensitive resin constituting said hole forming pattern, thereby forming an ink cavity, having said metal-plating layer formed on an inner surface thereof, in said multi-layer structure; and performing a sintering process for said multi-layer structure in which said ink cavity is formed.

* * * * *